United States Patent
Kao et al.

(10) Patent No.: US 8,111,495 B2
(45) Date of Patent: Feb. 7, 2012

(54) LOW FORWARD VOLTAGE DROP TRANSIENT VOLTAGE SUPPRESSOR AND METHOD OF FABRICATING

(75) Inventors: Lung-Ching Kao, Taipei (TW); Pu-Ju Kung, Taipei (TW); Yu-Ju Yu, Taipei (TW)

(73) Assignee: Vishay General Semiconductor, LLC, Hauppauge, NY (US)

( * ) Notice: Subject to any disclaimer, the term of this patent is extended or adjusted under 35 U.S.C. 154(b) by 961 days.

(21) Appl. No.: 11/820,547

(22) Filed: Jun. 20, 2007

(65) Prior Publication Data

US 2008/0013240 A1 Jan. 17, 2008

Related U.S. Application Data

(60) Provisional application No. 60/805,689, filed on Jun. 23, 2006.

(51) Int. Cl.
H02H 3/22 (2006.01)
H02H 3/20 (2006.01)
H02H 9/04 (2006.01)

(52) U.S. Cl. ........................ 361/111; 361/91.5
(58) Field of Classification Search .................. 361/111
See application file for complete search history.

(56) References Cited

U.S. PATENT DOCUMENTS

| | | |
|---|---|---|
| 2003/0038340 A1 | 2/2003 | Einthoven et al. |
| 2004/0075160 A1 | 4/2004 | Eng et al. |
| 2008/0068868 A1 * | 3/2008 | Williams ................ 363/21.06 |

FOREIGN PATENT DOCUMENTS

WO 98/35417 8/1998

OTHER PUBLICATIONS

International Search Report, PCT/US2007/014320 Vishay General Semiconductor, Jun. 20, 2007, 3 pages.
Wu, Jian et al., 4.3 kV 4H-SiC merged PiN/Schottky Diodes, XP-001500230, Semiconductor Science and Technology, vol. 21, No. 7, Jun. 14, 2006. pp. 987-991.
Held, R. et al., SiC Merged p-n/Schottky Rectifiers for High Voltage Applications, XP-000944900, Materials Science Forum, vols. 264-268 (1998) pp. 1057-1060.
Kaminski, Nando et al., "1200V Merged PIN Schottky Diode with Soft Recovery and Positive Temperature Coefficient", XP-000878432, 8th European Conference on Power Electronics and Applications, vol. Conf. 8, Sep. 7-9, 1999, pp. 1-9.
Sawant, S. et al., "4kV Merged PiN Schottky (MPS) Rectifiers", XP-000801084, Proceedings of the 10th International Symposium on Power Semiconductor Devices & IC's, Jun. 3-6, 1998, pp. 297-300.
Appendix: Chapter 4.4 MPS Rectifier, Chapter 4: Power Rectifiers, p. 187-192, Mar. 6, 1998.

* cited by examiner

*Primary Examiner* — Dharti H Patel
(74) *Attorney, Agent, or Firm* — Volpe and Koenig, P.C.

(57) ABSTRACT

A low forward voltage drop transient voltage suppressor utilizes a low-reverse-voltage-rated PN diode electrically connected in parallel to a high-reverse-voltage-rated Schottky rectifier in a single integrated circuit device. The transient voltage suppressor is ideally suited to fix the problem of high forward voltage drop of PN diodes and high leakage of low reverse breakdown of Schottky rectifiers. The low-reverse-voltage PN rectifier can be fabricated through methods such as 1) double layers of epi (with higher concentration layer epi in the bottom) or 2) punch through design of PN diode by base with compression.

24 Claims, 15 Drawing Sheets

Forward

Reverse

LOW FORWARD VOLTAGE DROP TRANSIENT VOLTAGE SUPPRESSOR AND METHOD OF FABRICATING

CROSS-REFERENCE TO RELATED APPLICATIONS

This application claims priority under 35 U.S.C. §119 to provisional application Ser. No. 60/805,689 filed Jun. 23, 2006, herein incorporated by reference in its entirety.

BACKGROUND OF THE INVENTION

This invention relates to a low forward voltage drop transient voltage suppressor and method of fabricating.

Schottky rectifiers generally have a special barrier metal contact within the device to provide a low forward voltage drop and are widely used in electrical circuits to conduct forward current without significant conduction power loss. However, because the character of metal barrier and barrier lowering under high surface electrical field, Schottky rectifiers have long been denounced for their high reverse leakage at rated reverse voltage as being serious barrier lowering devices having strong surface electrical fields, especially for low barrier height and low reverse voltage Schottky devices. On the other hand, PN structure diodes normally have lower reverse leakage performance than Schottky's. It is therefore unavoidable for the disadvantage of high forward voltage drop even under low current density due to the nature of build-in potential in the PN junction in the device. The application of rectifiers then becomes a trade-off decision for a circuit designer limited by forward conduction loss or reverse power loss.

As a result, in applications such as hard disk control circuit design, for example, relative-high voltage rated Schottky rectifiers and relative-low reverse voltage rated transient voltage suppressors (TVS) are connected in parallel to provide low forward voltage drop (polarity protection) and protect the reverse surge at the two ends in the same time. The existence of the Schottky device is mainly used for polarity protection, to confirm the connection of the two ends in the right direction through its lower forward voltage drop. However, construction costs of this type of circuit are high due to two actual devices, namely the Schottky rectifier and the reverse voltage rated TVS (Transient Voltage Suppressor), which are needed in a control circuit. Thus, it is desirable to have an improvement in the art to reduce the cost of this type of device.

In view of the foregoing, it is a primary object, feature or advantage of the present invention to improve over the state of the art.

It is another object, feature or advantage of the present invention to provide a low forward voltage drop transient voltage suppressor and method of fabricating.

Another object, feature or advantage of the present invention is a low reverse leakage device and method for low reverse breakdown voltage rated Schottky rectifiers.

Another object, feature or advantage of the present invention is to provide a low barrier height and low reverse leakage device and method for Schottky rectifiers.

Another object, feature or advantage of the present invention is to provide a high current rated Schottky rectifier.

Another object, feature or advantage of the present invention is to provide a low forward voltage drop transient voltage suppressor and method of fabricating which takes advantage of uni-polar diodes to reduce the forward voltage gap of bi-polar diodes.

Another object, feature or advantage of the present invention is a provision of a low forward voltage drop transient voltage suppressor which is economical to manufacture, durable in use, and efficient in operation.

A further object, feature or advantage of the present invention is to provide a method of fabricating an improved low forward voltage drop transient voltage suppressor.

One or more of these and/or other features or advantages of the present invention will be apparent from the specification and claims that follow. It is to be understood that no single embodiment need exhibit all or any of these objects, features or advantages.

BRIEF SUMMARY OF THE INVENTION

A low forward voltage drop transient voltage suppressor is comprised of a low reverse voltage rated PN diode and a high reverse voltage rated Schottky rectifier electrically connected in parallel to the PN diode in a single integrated circuit device.

According to another feature the present invention is comprised of an electrical circuit electrically connected to the suppressor for protecting the electrical circuit from reverse polarity and reverse power surge.

According to another feature of the present invention a hard disc assembly is electrically connected to the electrical circuit for the transient voltage suppressor to electrically protect the hard disc.

According to another feature of the present invention the voltage suppressor is a Schottky rectifier merged with a P-I-N Schottky Rectifier.

According to another feature of the present invention the Schottky rectifier has a P region that is mainly used for carrier injection during forward bias.

According to another feature of the present invention the Schottky rectifier has a PN diffusion profile that is used for voltage control and surge protection.

According to another feature of the present invention the integrated circuit device is constructed on a silicone substrate.

According to another feature of the present invention the substrate has implantation doping.

According to another feature of the present invention the PN diode has an enlarge guard ring that dominates reversal voltage performance due to an electric field at a junction area of the PN diode that is away from a die surface of the transient voltage suppressor.

According to another feature of the present invention the transient voltage suppressor is constructed with a first and second layer of epitaxy (epi) having a high electrical resistance epi for the Schottky barrier forming, but the suppressor's voltage rating is derived from a PN interface of the first layer epitaxy.

According to another feature of the present invention the first layer of epitaxy is a higher concentration than the second layer of epitaxy.

According to another feature of the present invention the transient voltage suppressor is constructed with a punched through design of the PN diode by base with compression wherein the Schottky rectifier has a longer base width than the PN diode.

According to another feature of the present invention the transient voltage suppressor of the Schottky rectifier has a reverse voltage rating from the parallel connected PN diode so that a surface electrical field of the Schottky will be much lower than a critical field of the PN diode when the PN diode is in a breakdown state.

The method of the present invention comprises the step of creating a low reverse-voltage rated PN diode on a substrate and creating a high reverse voltage rated Schottky rectifier connected electrically parallel to the PN diode on the substrate.

According to another feature of the method set forth above is packaging the voltage suppressor for automatic placing the voltage suppressor in an electrical circuit.

According to another feature of the present method there is created a first and second layer of epi with the suppressor for having a high electrical resistance epi for the Schottky rectifier and the suppressor develops a voltage rating from a PN interface with the first layer of epi.

According to the method of the present invention the suppressor is created using a punch through design of the PN diode using base width compression for allowing the Schottky rectifier to have a longer base width than the PN diodes base width.

According to another method of the present invention the Schottky rectifier is created with a higher reverse voltage than the parallel connected PN diode's reverse voltage.

According to another feature of the present invention the transient voltage suppressor is constructed so that the suppressor has a forward conduction through the Schottky rectifier under low current density and a reverse breakdown is controlled by the PN diode only.

DETAILED DESCRIPTION OF THE PREFERRED EMBODIMENT

Figure 1A:
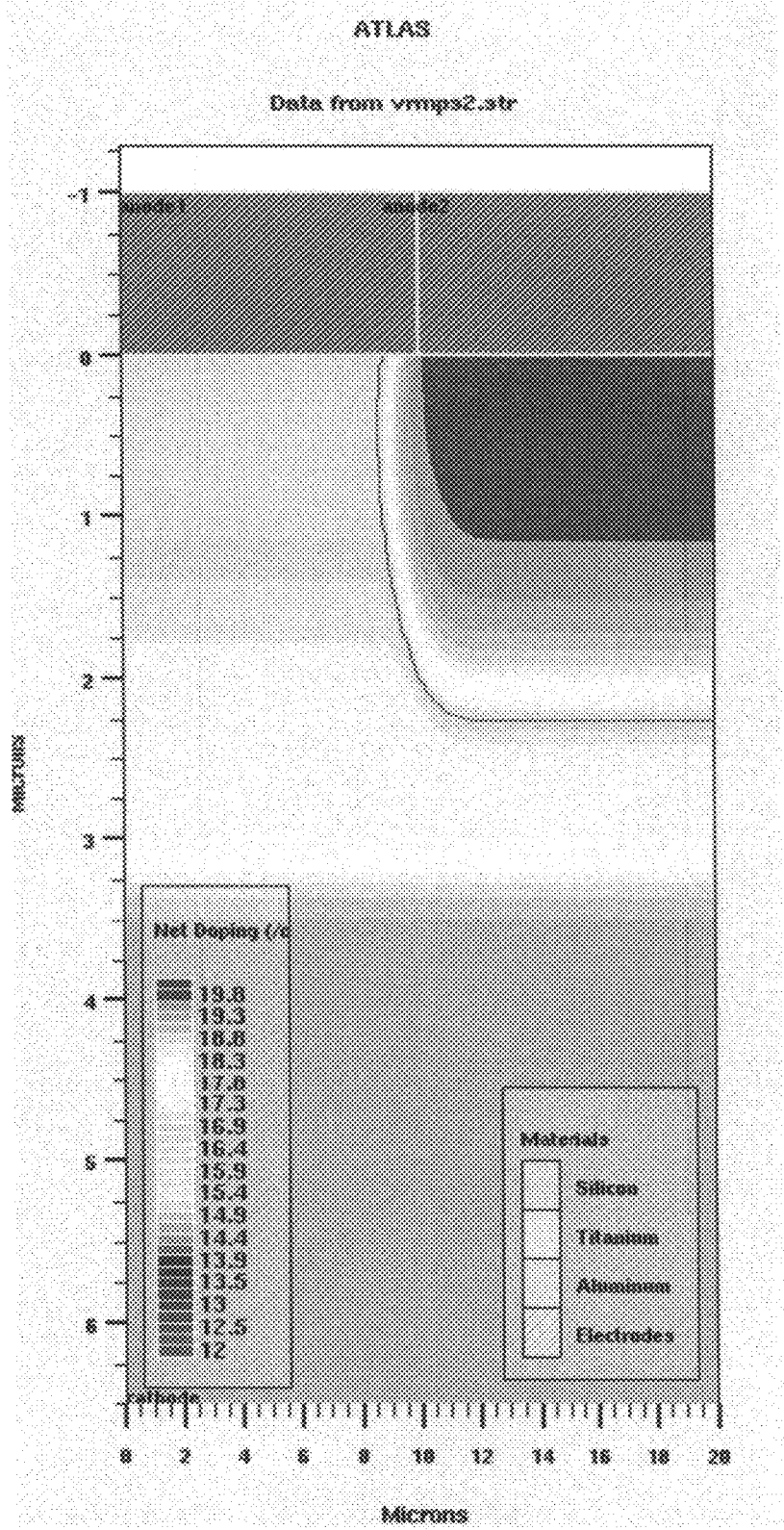
FIGS. 1A, 1B and 1C are each portions of a screen display showing a cross-section view of low reverse leakage Schottky (FIG. 1A), SRP profiles for Schottky (FIG. 1B), and low reverse voltage rated PN (FIG. 1C). The screen displays of FIGS. 1A, 1B and 1C may be considered together, side-by-side.

The present invention provides a single integrated circuit TVS (Transient Voltage Suppressor) that combines a low-reverse-voltage-rated PN diode in parallel with a high-reverse-voltage-rated Schottky rectifier. The present invention can be applied to STD (Standard Deviation) Schottky products to inhibit the reverse leakage and increase the Tj rating (junction temperature of the devices). According to testing results, the present invention can pass Tj=150C HTRB (where Tj is the junction temperature of the device and HTRB is the High Temperature Reverse Bias, a device qualification method used to accelerate and age the device in reverse) testing without failure. Usually, Schottky rectifiers require a high barrier (BH>770 meV) where the barrier height is over 770 milli-electron volts, and low concentration epi (epitoxy) to pass the same Hi-rel testing. The present invention works efficiently to protect control circuits, such as, but not limited to those in hard disk assemblies, or other applications where sensitive electronics requires protection from voltage transients. The present invention protects CMOS (complimentary Metal-Oxide-Semiconductor) integrated circuits from voltage spikes in both polarities, with specific low forward voltage drop to protect against negative spikes.

In modern hard disk control circuit design, relative-high voltage rated Schottky rectifiers and relative-low reverse voltage rated transient voltage suppressors are connected using discrete components in parallel to provide low forward voltage drop polarity protection and protect the reverse surge at the two ends of the circuit at the same time. The use of the Schottky rectifier is primarily for polarity protection and to protect a connection of two ends of the circuit in the right direction through its lower forward voltage drop. The present invention creates an improved integrated circuit device by consolidating all the electrical characteristic requirements into a single module.

Generally, in merged P-I-N Schottky (MPS) rectifiers, the P region is mainly used for carrier injection during forward bias voltage to obtain better conduction performance. However, in the present invention, the P/N diffusion profile is used for reverse voltage control and surge protection of lower reverse voltage rated transient voltage suppressor. The higher VR (Reverse Voltage drop) Schottky rectifiers function using current conduction under low forward voltage drop as a polarity protection device. The present invention is used as a low VF (Forward Voltage drop) transient voltage suppressor device to protect circuits as both polarity and reverse surge protection. The doping concentration of the device must be controlled within a certain range and it is preferred that implantation doping is used to make sure the diffusion profile and current conduction capability to meet both forward and reverse requirements can be obtained. Because the parallel-connected Schottky rectifiers is designed to have a much higher rated reverse voltage performance than the transient voltage suppressor, the barrier height for the Schottky rectifier can be as low as possible to allow a best forward performance and low current density without too much increasing in reverse leakage. Since the Schottky diode is surrounded by the transient voltage suppressor, no additional termination design is necessary.

Construction and Operation
Surface Electrical Field Reduction

For most of the commercialized Schottky rectifiers, the chip surface is covered largely by a metal barrier and surrounded by one or more termination designs like a PN guard ring or field plate in the edge. However, in the present invention, the diffusion depth and area of PN guard ring are largely increased and dominate the reverse voltage performance due to critical electrical field at the junction area of a PN interface, which is away from the die surface.

The low reverse voltage of PN rectifier can be achieved through methodologies such as use of double layers of epi (epitaxy) with a higher concentration layer epi in the bottom or use of a punch through design of PN diode by base width compression. The first method leaves high resistance epi for Schottky barrier forming but the chip's voltage rated is by PN interface of bottom concentrated epi layer. The second method allows Schottky rectifier with longer base width than PN's. Both methods contribute to the same result; reverse voltage of Schottky must be higher than parallel-connected PN. Thus, the chip has forward conduction through the Schottky rectifier under low current density (metal barrier conducts current before forward voltage drop reaches 0.7V of PN's build-in potential) and reverse breakdown is controlled by the PN junction.

The Schottky rectifier has a higher reverse rated voltage than the parallel-connected PN diode, the surface electrical field of Schottky will be much lower than critical field of PN diode when the PN is in breakdown. The barrier-lowering phenomenon become unobvious and unexpectedly results in low reverse leakage current before the PN diode is in breakdown.

Voltage Control

Figure 1B:
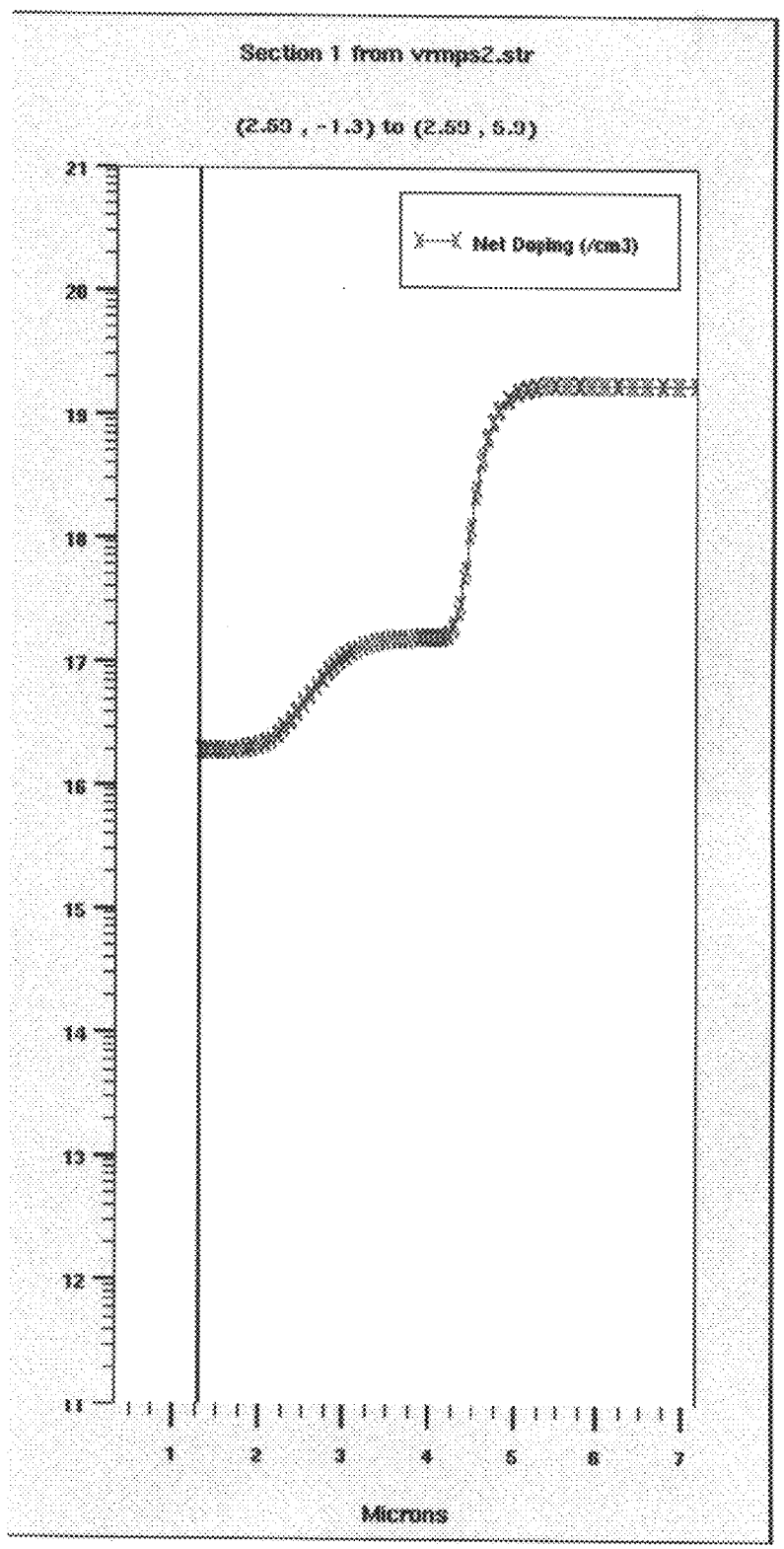
Figure 1C:
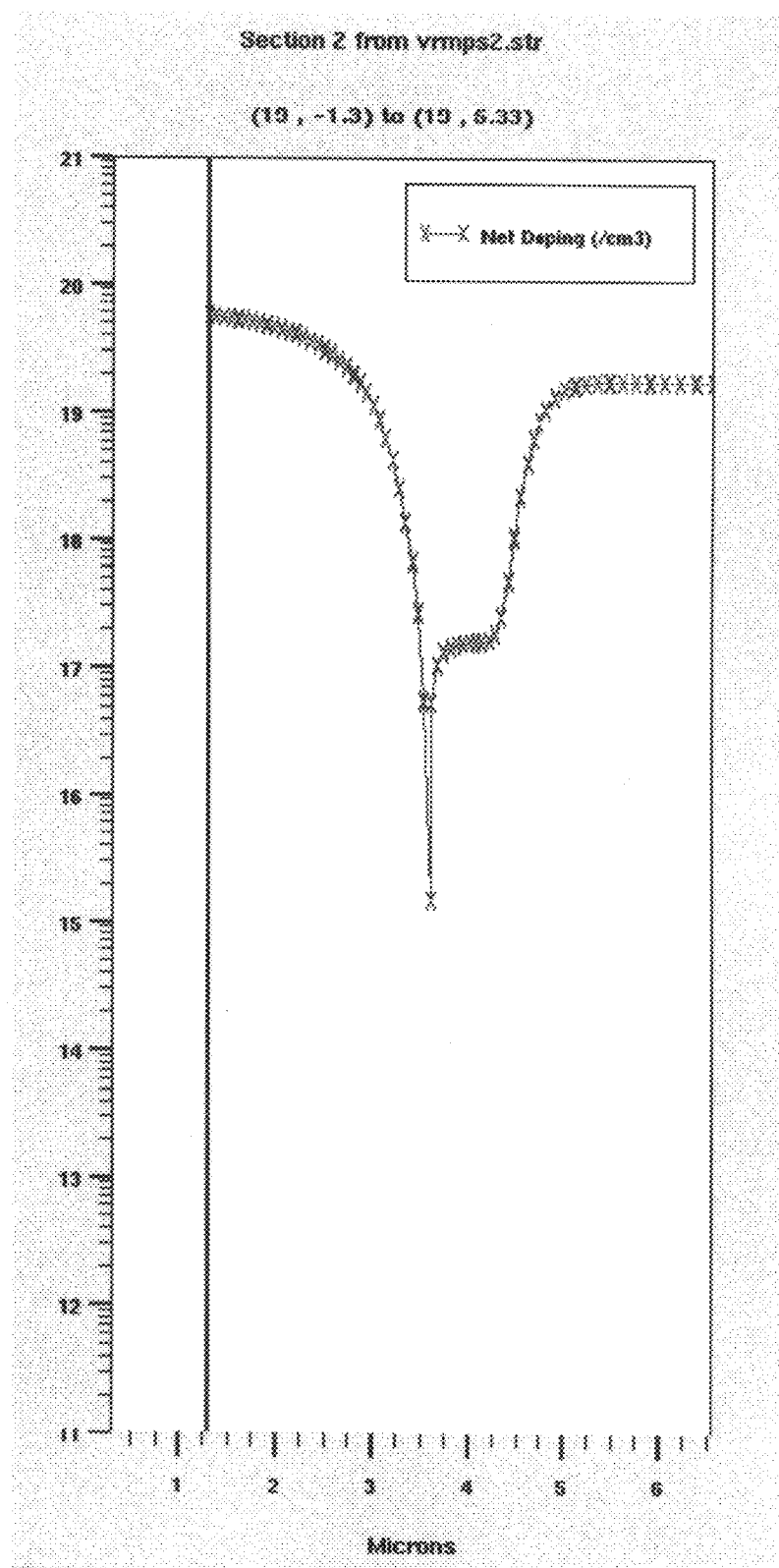
Figure 2A:
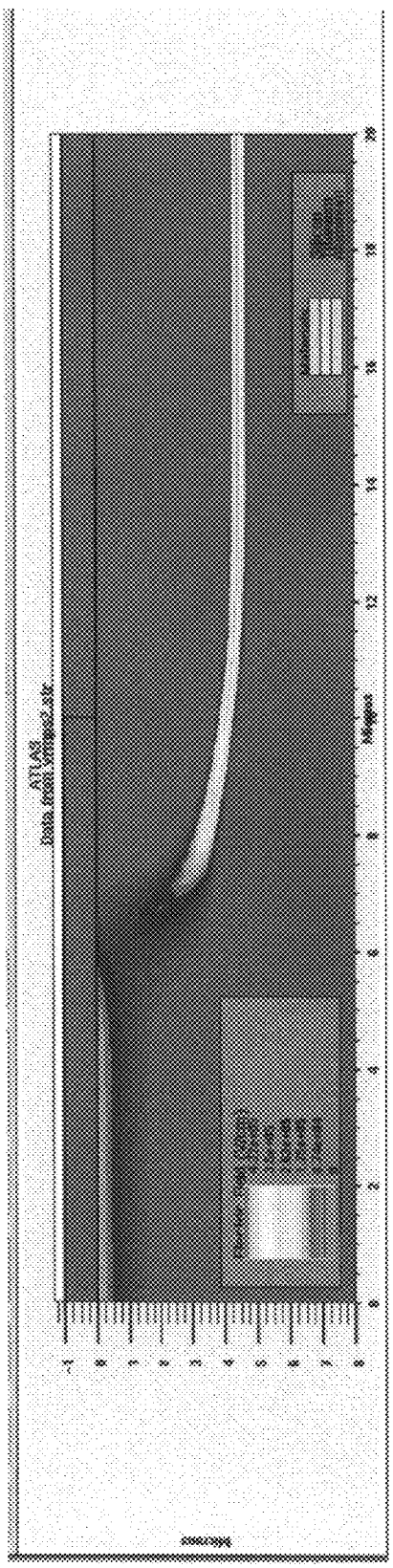
FIGS. 2A, 2B and 2C are each portions of a screen display showing a Schottky under reverse bias when PN diode is in breakdown. The critical electrical field happens at the bottom of PN junction (center, Ec~4.5e5 V/cm) and the surface electrical field of Schottky barrier only around /1;3 of Ec, Schottky (bottom, Es~1.5e5V/cm). The screen displays of FIGS. 2A, 2B and 2C may be considered together, top (FIG. 2A) to bottom (FIG. 2C).
Figure 2B:
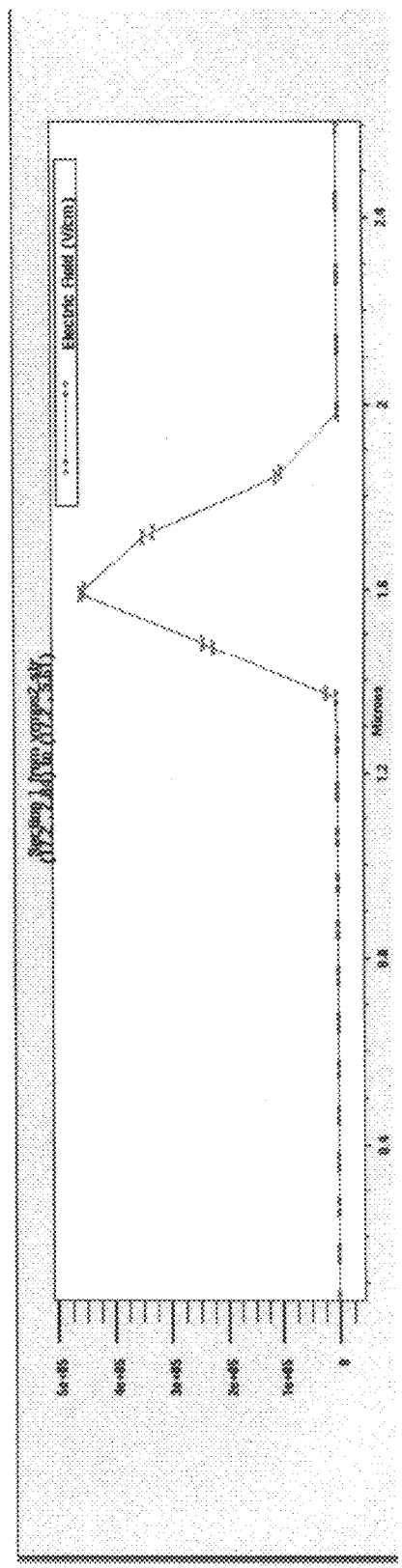
Figure 2C:
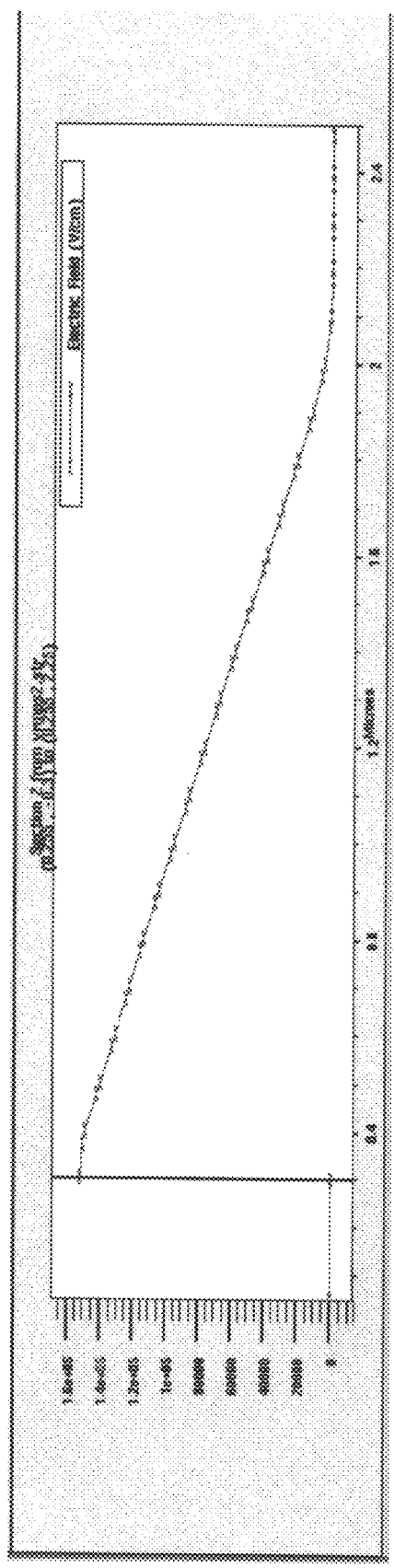
Figure 3A:
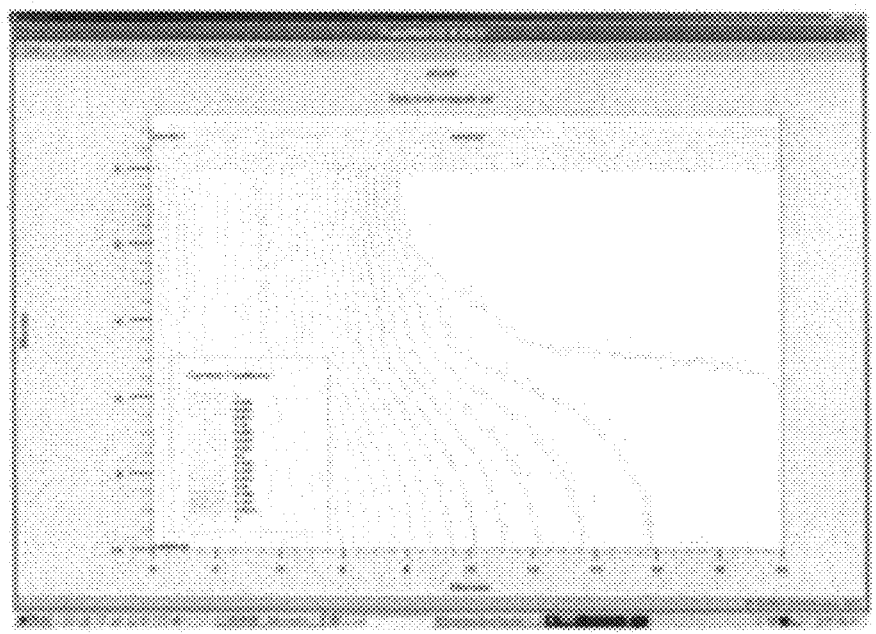
FIGS. 3A and 3B illustrate current flow lines of an embodiment to Schottky only (FIG. 3A, VF<0.7V) when device is under forward bias and through PN junction when reverse bias is applied (FIG. 3B).
Figure 3B:
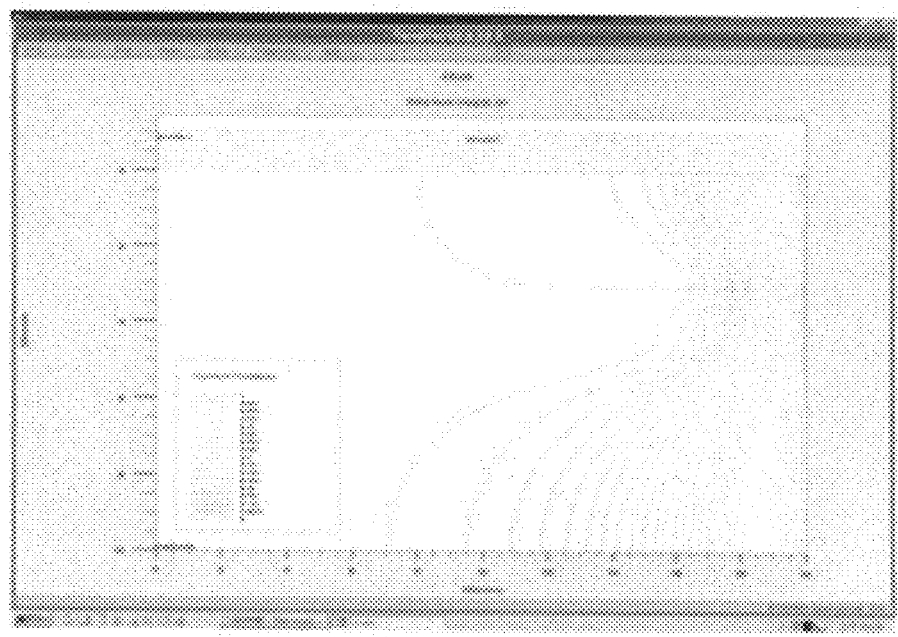
Figure 4A:
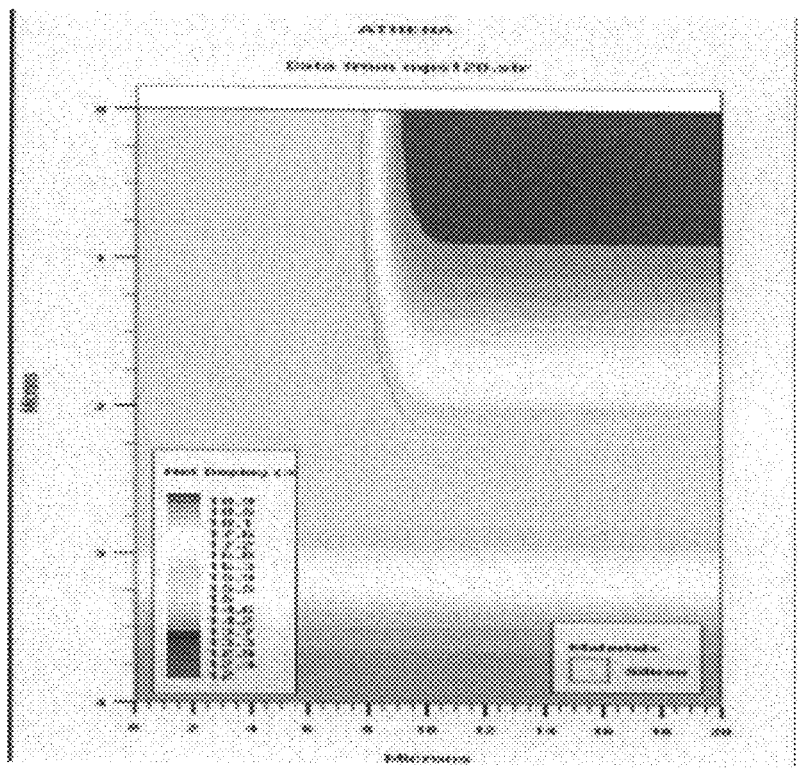
FIGS. 4A, 4B (FIG. 4B corresponding to FIG. 4A), 4C, 4D (FIG. 4D corresponding to FIG. 4C), 4E and 4F (FIG. 4F corresponding to FIG. 4E) are each portions of a screen display illustrating performance of MPS chip with 120mins, 180mins & 240mins drive-in time (FIGS. 4A/4B- FIGS. 4C/4D- FIGS. 4E/4F) and reverse 1-V characteristics. When the drive-in time increases, the junction depth increase and reverse voltage decrease.
Figure 4B:
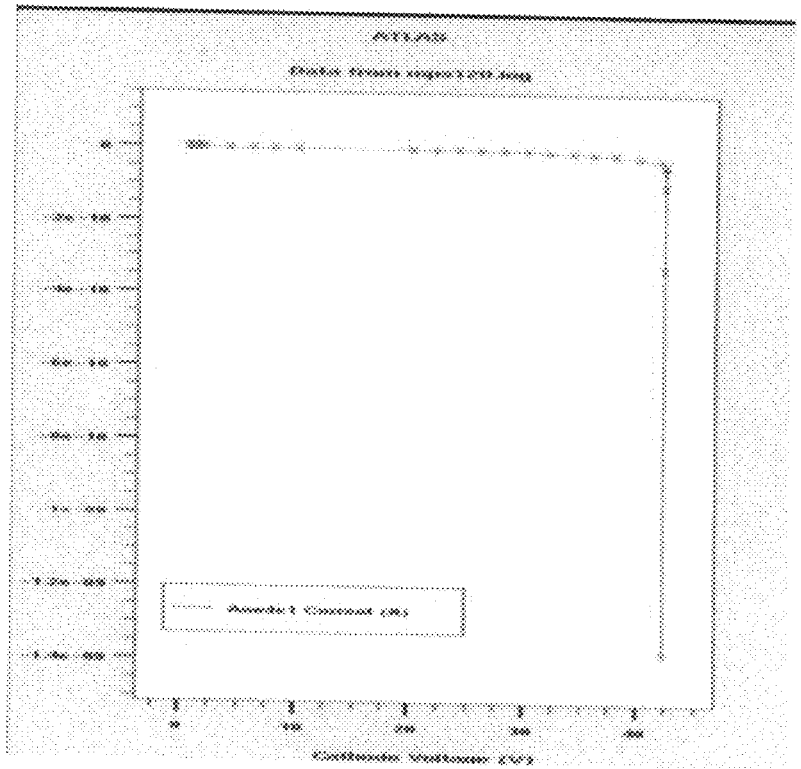
Figure 4C:
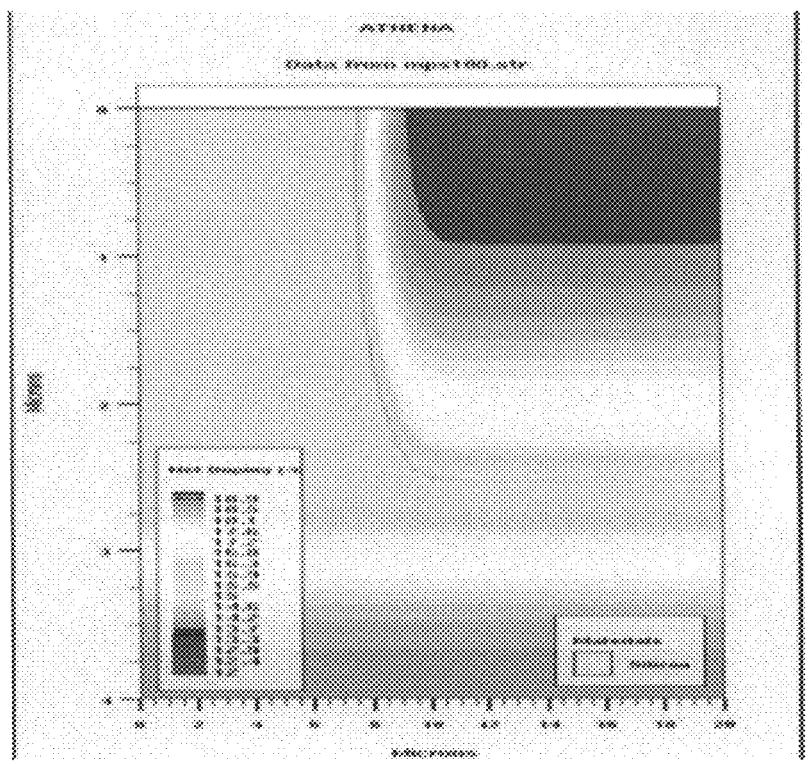
Figure 4D:
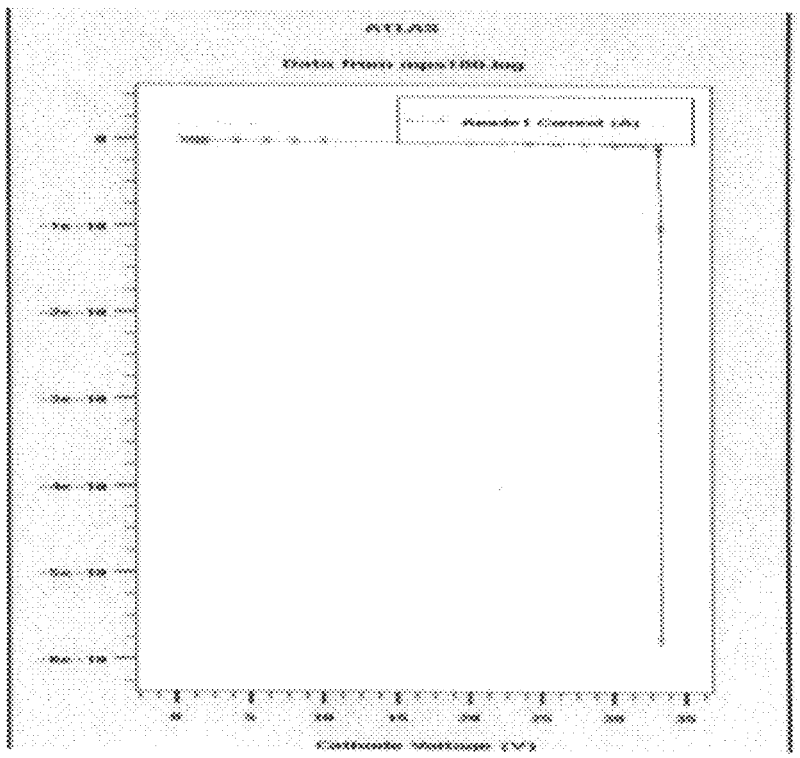
Figure 4E:
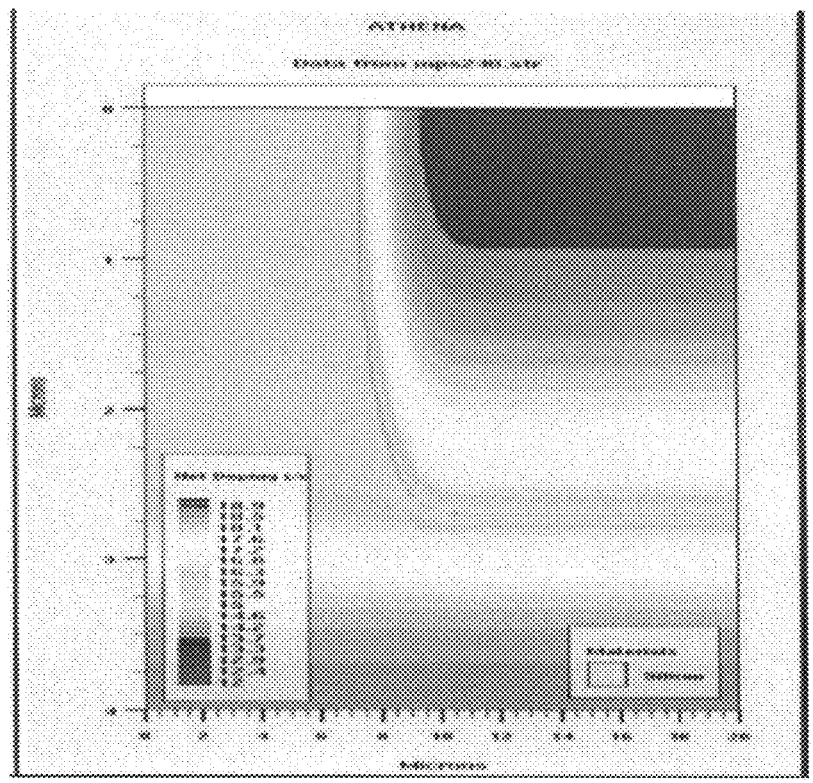
Figure 4F:
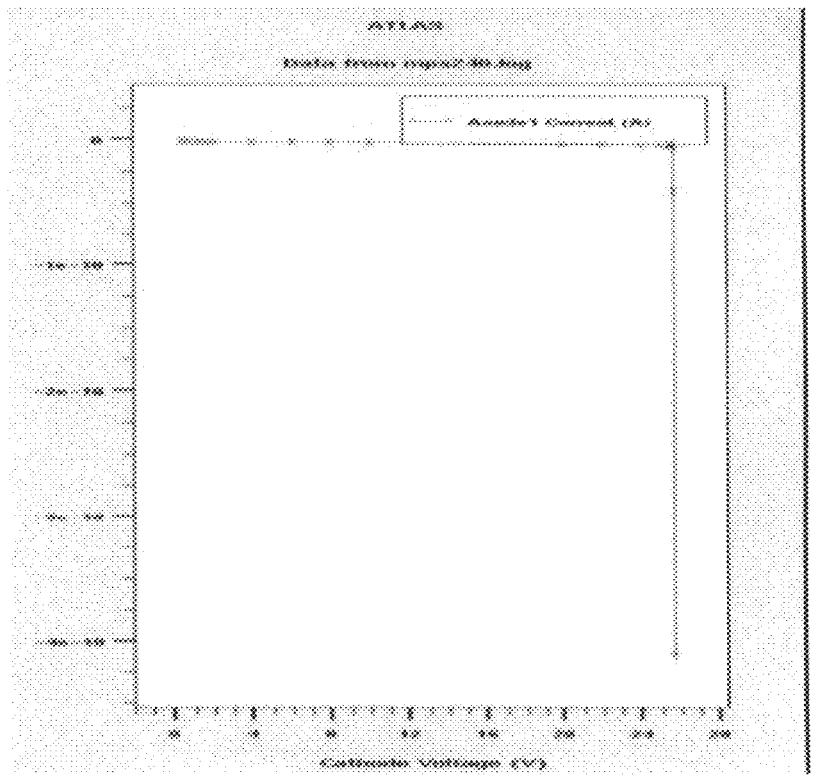

FIGS. 1A, 1B and 1C, FIGS. 2A, 2B and 2C, and FIGS. 3A and 3B provide computer simulations of the first method using double layers of epi (epitaxy) with a higher concentration layer epi in the bottom. FIGS. 1A, 1B and 1C show epi construction and how the Schottky rectifier is connected in parallel to the PN diode. FIGS. 2A, 2B and 2C show the electrical field simulation and SRP when this chip is under reverse bias. As shown in FIGS. 2A, 2B and 2C, when the critical electrical field in silicon happens at the bottom of the PN junction ($E_c$=4.5e5) where $E_c$ is the critical field in silicon, the electrical field on the surface of the Schottky only about /1;3 ($E_{s,Schottk}$=1.5e5) of $E_c$ where $E_s$ is the surface electrical field in silicon. FIGS. 3A and 3B show the current flow lines of one embodiment of the chip when it is under forward (VF<0.7V) where VF is the forward voltage drop, and V is the reverse bias. The current flow lines from the simulation clearly demonstrate the function of two parallel-connected diodes.

FIGS. 4A, 4B, 4C, 4D, 4E and 4F demonstrate the voltage control of the second method using punch through design of PN diode by base width compression. The breakdown voltage is decreasing (43V, 34V & 25V) as drive-in time is increasing (1100C/120 mins, 1100C/180 mins, 1100C/240 mins). Besides voltage control, the critical electrical field location, current flow under forward and reverse bias and lower electrical field at the Schottky surface are all the same as with the first method.

Total Schottky Area In One Chip

Schottky barrier height and current density are the major concern for the forward voltage drop performance of this invention. In order not to impact the surge performance, the Schottky area is reduced to meet the forward voltage drop requirement under certain current density with a safety guard band.

Due to barrier nature, the Schottky rectifier is thought to have higher reverse leakage performance than the PN junction diode. The leakage of the Schottky is positively proportional to the Schottky area in the chip, so reducing the Schottky contact area is also an effective way of reverse leakage inhibition. Leakage inhibition not only comes from surface electrical field reduction, but also from Schottky contact area reductions. It is also found that with the reduction of Schottky area and increase PN area, the breakdown voltage will not be affected and reverse leakage is greatly reduced.

Table 1 provides measurements of a sample prepared using the second method where punch through voltage control is used. The sample has a chip size of 80mil×80mil and a special voltage rating of this device is targeted to Vz@1 mA=14 V where $V_z$ is the reverse voltage under a reverse current of 1 mA. Table 1 illustrates performance. From Table 1, it is clear that the VF performance of this WS is very small with the assistance of the parallel connected Schottky and VF@1A=0.448 also breaks the natural limit 0.7V of the build-in potential of the PN junction.

TABLE 1

Table 1 Sample with the capability of IR@ 12 V = 0.668 uA and VF @ 1.0 A = 0.448 V

| | TTK TEST (Ta = 25° C.) | | | | | |
|---|---|---|---|---|---|---|
| | VR(V) @1.0 mA | IR(uA) @12 V | IR(uV) @12.2 V | VF(V) @1.0 A | VF(V) @5.0 A | VF(V) @10. |
| MIN | 13.010 | 0.620 | 0.642 | 0.444 | 0.608 | 0.744 |
| MAX | 15.950 | 0.817 | 0.861 | 0.449 | 0.618 | 0.772 |
| AVG | 14.034 | 0.668 | 0.689 | 0.448 | 0.615 | 0.758 |
| STD | 0.518 | 0.057 | 0.065 | 0.001 | 0.002 | 0.006 |

Figure 5:
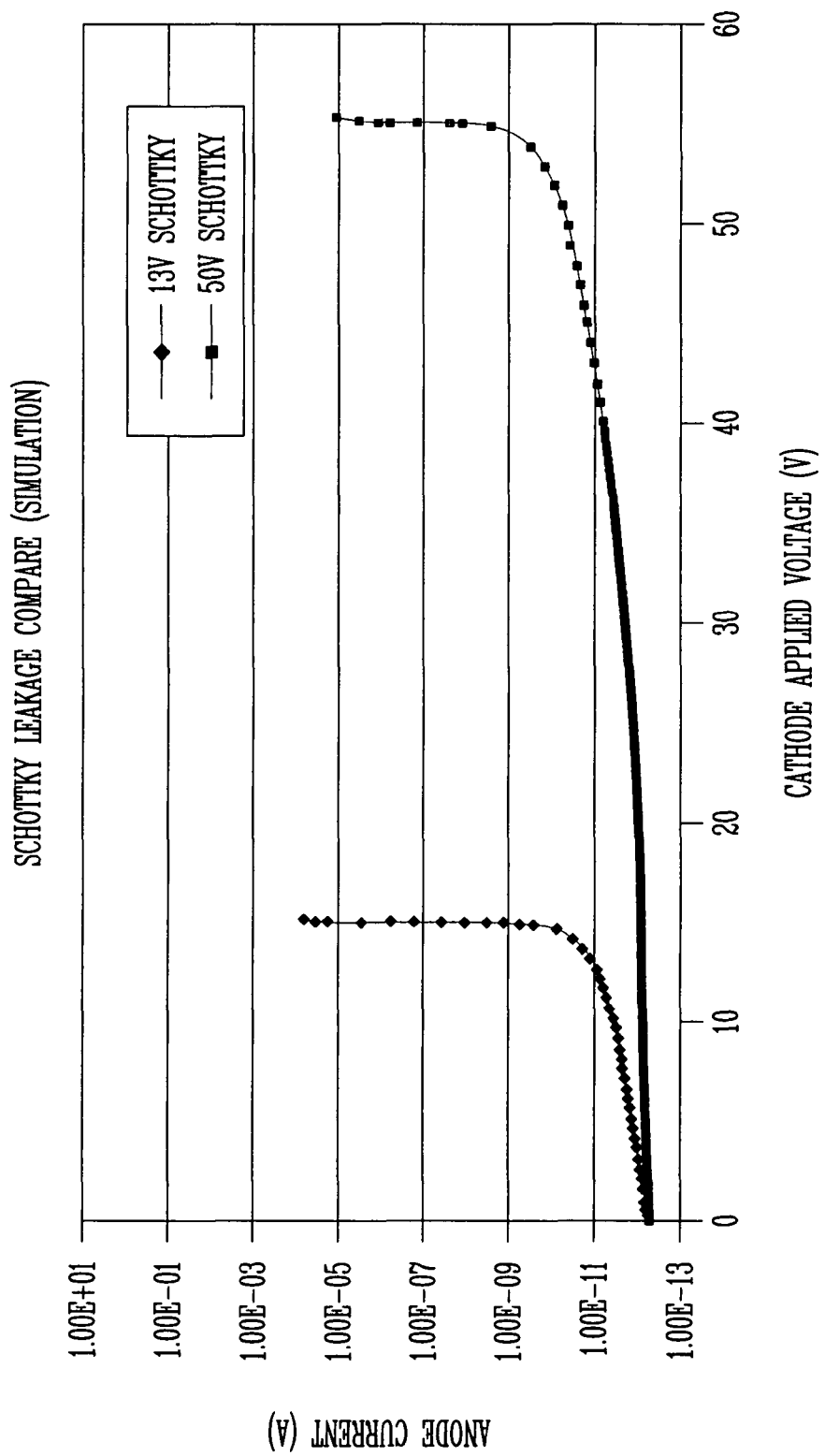
FIG. 5 is a graph showing a reverse leakage comparison between 13V and 50V Schottky unit cell (simulation).
Figure 6:
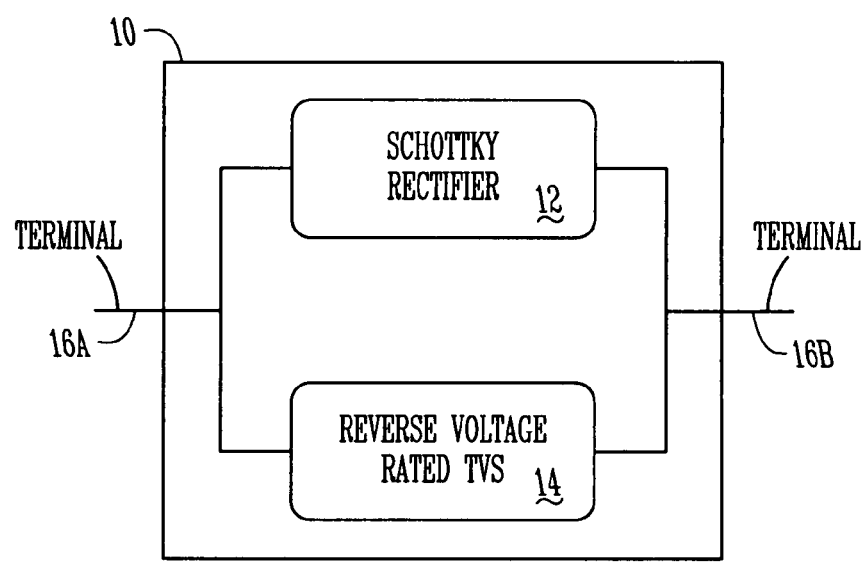
FIG. 6 shows a functional block diagram of one embodiment of the present invention having a high-reverse-voltage-rated Schottky rectifier electrically connected in parallel with a low-reverse-voltage-rated transient voltage suppressor in a single IC device.

Evidence of leakage improvement can be seen through the leakage comparison of the Schottky original performance (50V Schottky), 13V Schottky, and invention (Schottky+PN). FIG. 5 shows the unit cell reverse leakage comparison by simulation. From the data, the 13V Schottky has leakage of 7.89e-12 A/um² (equal to 32.57 uA for 80 mil chip) under 12V reverse bias and the 50V Schottky has 8.03e-13 A/um² (equal to for 3.31 uA for 80 mil×80 mil chip) under the same reverse breakdown voltage.

The leakage of traditional 13V Schottky is 9.78 times higher than 50V Schottky under the same reverse bias (12V). With suitable Schottky area reduced in this embodiment, the embodiment is 20.18% (0.668/3.31) of the traditional 50V Schottky and only 2.05% (0.668/32.57) of the traditional 13V Schottky when measuring the leakage current at 12V.

Figure 7:
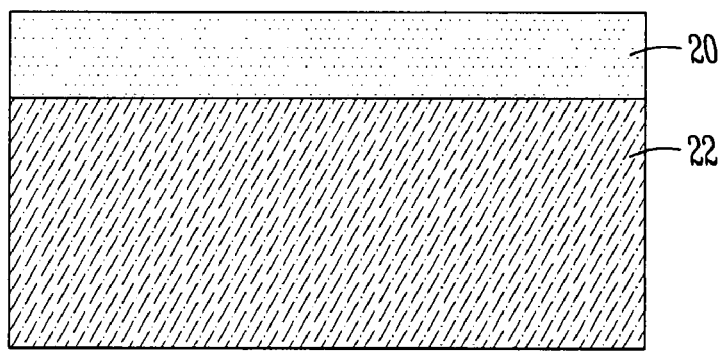
FIG. 7 through FIG. 14 illustrate one embodiment of a manufacturing process for an integrated circuit of the present invention.
Figure 8:
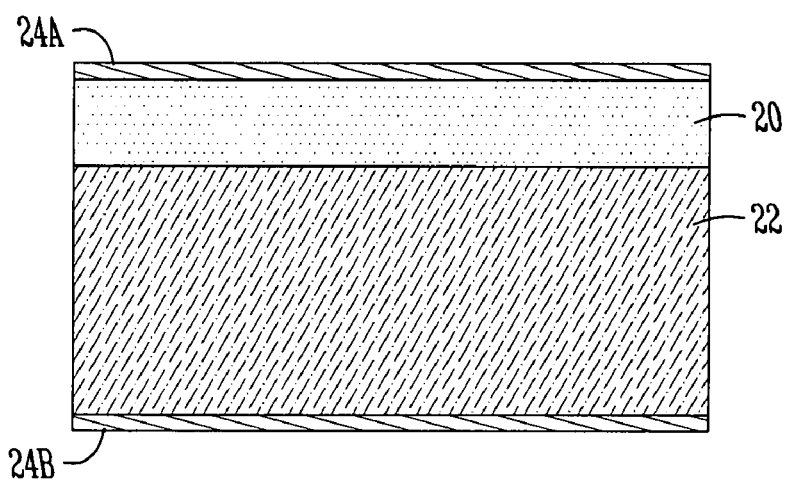
Figure 9:
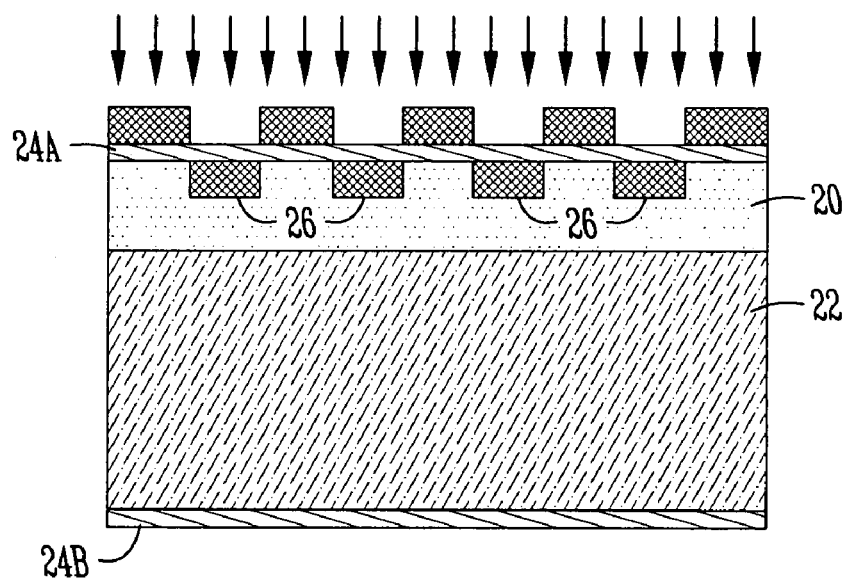
Figure 10:
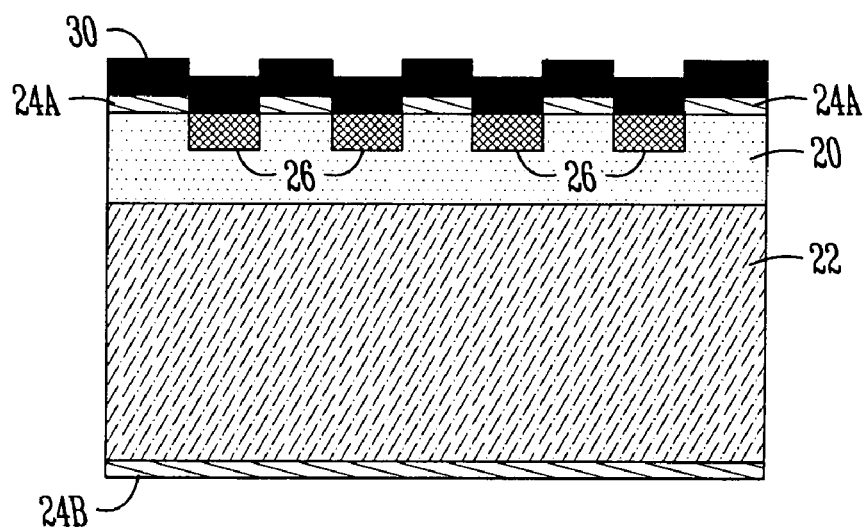
Figure 11:
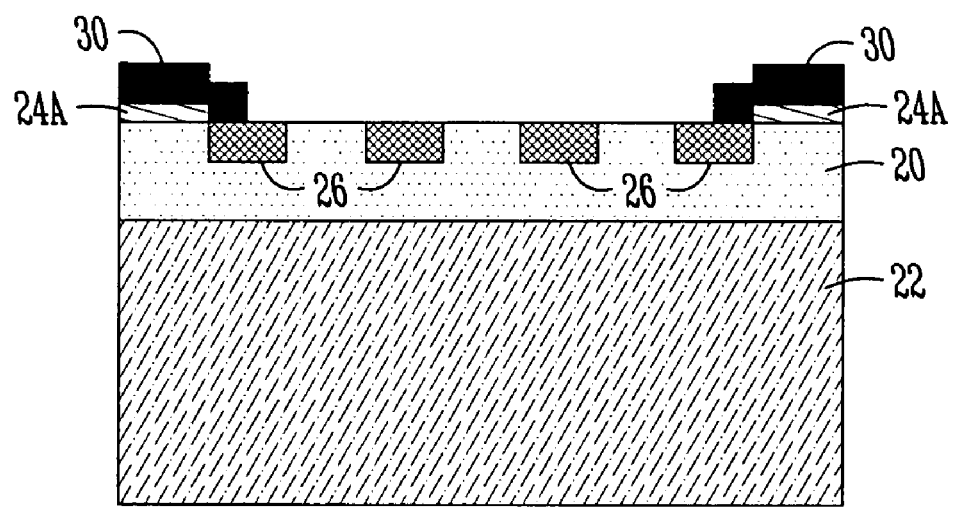
Figure 12:
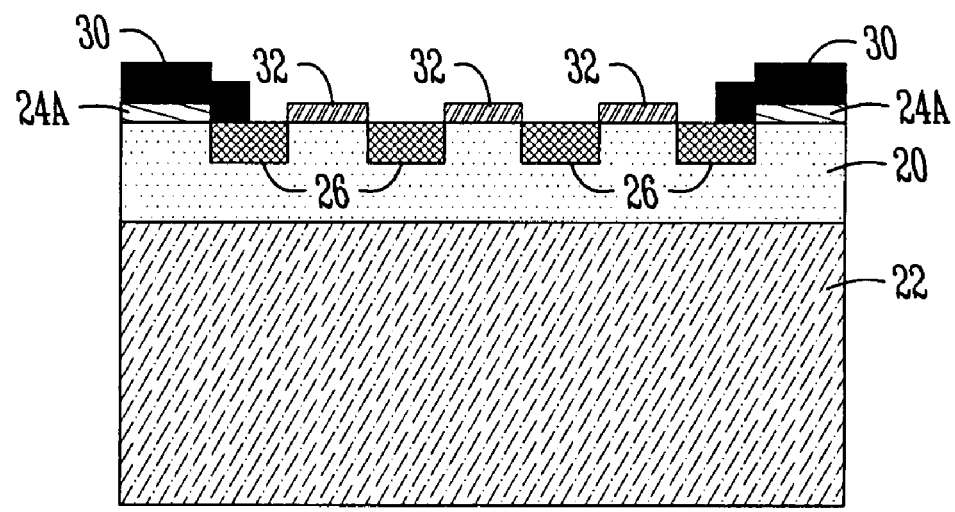
Figure 13:
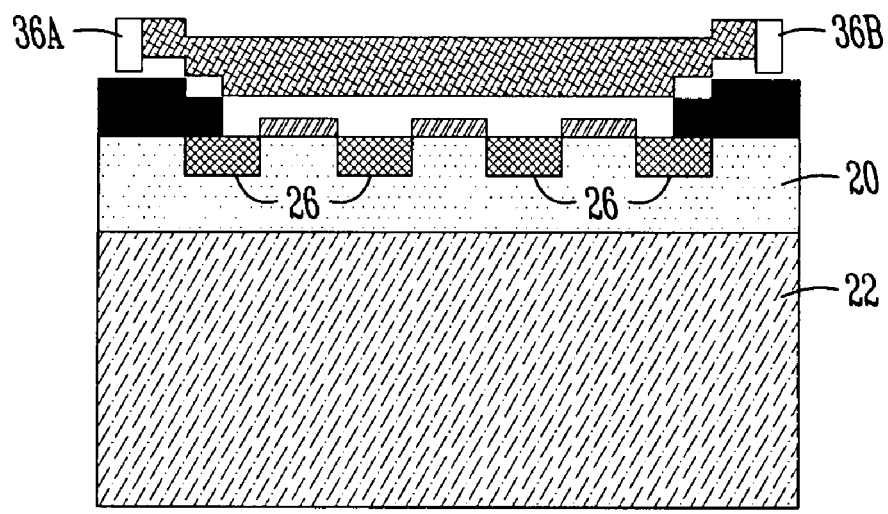
Figure 14:
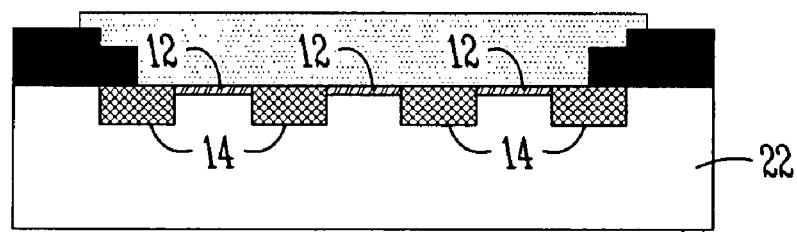

FIG. 7 through FIG. 14 illustrate one example of method of constructing a device of the present invention. In FIG. 7, an EPI wafer is provided having an N-type substrate 22 and an N-type Epi having a resistivity of about 0.5 to 0.6 Ohm-cm and a thickness of about 3.4 to 3.8 μm. In FIG. 8, initial oxidation takes place thereby forming initial oxide layers 24A, 24B. In FIG. 9 ion implantation occurs to form the transient voltage suppression area (TVS) 26. Next, as shown in FIG. 10, a boron drive-in step occurs to create the Schottky (SKY) oxide 30. Next, in FIG. 11 an etching step occurs, such as photo etching to etch the oxide layer. In FIG. 12, after sintering a cleaning step occurs and a barrier layer 32, such as made from a NiCr/Pt alloy is applied. Next, as shown in FIG. 13, Ti/Ni/Ag evaporation takes place and additional etching may take place to form terminals 36A, 36B, and layer 34. The backside may be grinded, metallized, or other conventional manufacturing steps may occur. FIG. 14 provides a side view of one embodiment of a single integrated circuit device 10 where both the transient voltage suppression function 14 and Schottky function 12 is provided in a single package.

The invention has been shown and described above with the preferred embodiments, and it is understood that many modifications, substitutions, and additions may be made which are within the intended spirit and scope of the invention. The present invention is not to be limited to the specific embodiments described, as variations in the design methodologies, sizes, ratings and characteristics, applications, and other variations are contemplated.

What is claimed is:

1. A low forward voltage drop transient voltage suppressor comprising:
    a low-reverse-voltage rated PN diode; and
    a high-reverse-voltage rated Schottky rectifier electrically connected in parallel to the PN diode in a single integrated circuit device;
    wherein the PN diode is configured to dominate reverse voltage performance such that forward conduction is through the Schottky rectifier under low current density and reverse breakdown is controlled by the PN diode; and
    wherein the PN diode has an enlarged guard ring that dominates reverse voltage performance due to electrical field at a junction area of the PN diode that is away from a die surface of the transient voltage suppressor.

2. The transient voltage suppressor of claim 1 further comprising an electrical circuit electrically connected to the suppressor for protecting the electrical circuit from reverse polarity and reverse power surge.

3. The transient voltage suppressor of claim 2 further comprising a hard disk assembly electrically connected to the electrical circuit for the transient voltage suppressor to electrically protect the hard disk.

4. The transient voltage suppressor of claim 1 wherein the Schottky rectifier is a merged P-I-N Schottky rectifier.

5. The transient voltage suppressor of claim 4 wherein the Schottky rectifier has a P region that is mainly used for carrier injection during forward bias.

6. The transient voltage suppressor of claim 4 wherein the Schottky rectifier has a P/N diffusion profile that is used for reverse voltage control and surge protection.

7. The transient voltage suppressor of claim 1 wherein the integrated circuit device is constructed on a silicone substrate.

8. The transient voltage suppressor of claim 7 wherein the substrate has implantation doping.

9. The transient voltage suppressor of claim 1 wherein the transient voltage suppressor is constructed with a first and a second layer of epitaxy (epi) having a high electrical resistance epi for Schottky barrier forming, but the suppressor's voltage rating is derived from a PN interface of the first layer epi.

10. The transient voltage suppressor of claim 9 wherein the first layer of epi is a higher concentration than the second layer of epi.

11. The transient voltage suppressor of claim 1 wherein the transient voltage suppressor is constructed with a punch through design of the PN diode by base width compression, wherein the Schottky rectifier has a longer base width than the PN diode.

12. The transient voltage suppressor of claim 1 wherein the Schottky rectifier has a higher reverse voltage rating than the parallel connected PN diode so that a surface electrical field of the Schottky will be much lower than a critical field of the PN diode when the PN diode is in a breakdown state.

13. A single chip low forward voltage drop transient voltage suppressor comprising:
    a PN diode having a PN junction;
    a Schottky rectifier electrically connected in parallel with the PN diode
    wherein the PN diode is adapted for dominating reverse voltage performance such that forward conduction is through the Schottky rectifier under low current density and reverse breakdown being controlled by the PN junction; and
    wherein the transient voltage suppressor is constructed with a first and a second layer of epitaxy (epi) having a high electrical resistance epi for Schottky barrier forming, but the suppressor's voltage rating is derived from a PN interface of the first layer epi.

14. A method of fabricating a low forward voltage drop transient voltage suppressor comprising the steps of:
    creating a low-reverse-voltage rated PN diode with an enlarged guard ring on a substrate; and
    creating a high-reverse-voltage rated Schottky rectifier connected electrically parallel to the PN diode on the substrate;
    wherein the PN diode is configured to dominate reverse voltage performance such that forward conduction is through the Schottky rectifier under low current density and reverse breakdown is controlled by the PN diode; and
    wherein the enlarged guard ring dominates reverse voltage performance due to electrical field at a junction area of the PN diode that is away from a die surface of the transient voltage suppressor.

15. The method of claim 14 further comprising packaging the voltage suppressor for automatic placing the voltage suppressor in an electrical circuit.

16. The method of claim 14 further comprising creating a first and a second layer of epitaxy (epi) within the suppressor for having a high electrical resistance epi for the Schottky rectifier and the suppressor develops a voltage rating from a PN interface with the first layer of epi.

17. The method of claim 14 wherein the transient voltage suppressor is created using a punch through design of the PN diode using base width compression for allowing the Schottky rectifier to have a longer base width than the PN diode's base width.

18. The method of claim 14 wherein the Schottky rectifier is created with a higher reverse voltage than the parallel connected PN diode's reverse voltage.

19. The method of claim 14 wherein the transient voltage suppressor is constructed so that the suppressor has a forward conduction through the Schottky rectifier under low current density and a reverse breakdown is controlled by the PN diode only.

20. A low forward voltage drop transient voltage suppressor comprising:
    a low-reverse-voltage rated PN diode; and
    a high-reverse-voltage rated Schottky rectifier electrically connected in parallel to the PN diode in a single integrated circuit device;
    wherein the PN diode is configured to dominate reverse voltage performance such that forward conduction is through the Schottky rectifier under low current density and reverse breakdown is controlled by the PN diode; and
    wherein the transient voltage suppressor is constructed with a punch through design of the PN diode by base width compression, wherein the Schottky rectifier has a longer base width than the PN diode.

21. A low forward voltage drop transient voltage suppressor comprising:
    a low-reverse-voltage rated PN diode; and
    a high-reverse-voltage rated Schottky rectifier electrically connected in parallel to the PN diode in a single integrated circuit device;
    wherein the PN diode is configured to dominate reverse voltage performance such that forward conduction is through the Schottky rectifier under low current density and reverse breakdown is controlled by the PN diode; and wherein the Schottky rectifier has a higher reverse voltage rating than the parallel connected PN diode so that a surface electrical field of the Schottky will be much lower than a critical field of the PN diode when the PN diode is in a breakdown state.

22. A method of fabricating a low forward voltage drop transient voltage suppressor comprising the steps of:
   creating a low-reverse-voltage rated PN diode on a substrate; and
   creating a high-reverse-voltage rated Schottky rectifier connected electrically parallel to the PN diode on the substrate;
   wherein the PN diode is configured to dominate reverse voltage performance such that forward conduction is through the Schottky rectifier under low current density and reverse breakdown is controlled by the PN diode; and
   wherein the transient voltage suppressor is constructed with a first and a second layer of epitaxy (epi) having a high electrical resistance epi for Schottky barrier forming, but the suppressor's voltage rating is derived from a PN interface of the first layer epi.

23. A method of fabricating a low forward voltage drop transient voltage suppressor comprising the steps of:
   creating a low-reverse-voltage rated PN diode on a substrate; and
   creating a high-reverse-voltage rated Schottky rectifier connected electrically parallel to the PN diode on the substrate;
   wherein the PN diode is configured to dominate reverse voltage performance such that forward conduction is through the Schottky rectifier under low current density and reverse breakdown is controlled by the PN diode; and
   wherein the transient voltage suppressor is created using a punch through design of the PN diode using base width compression for allowing the Schottky rectifier to have a longer base width than the PN diode's base width.

24. A method of fabricating a low forward voltage drop transient voltage suppressor comprising the steps of:
   creating a low-reverse-voltage rated PN diode on a substrate; and
   creating a high-reverse-voltage rated Schottky rectifier connected electrically parallel to the PN diode on the substrate;
   wherein the PN diode is configured to dominate reverse voltage performance such that forward conduction is through the Schottky rectifier under low current density and reverse breakdown is controlled by the PN diode; and
   wherein the transient voltage suppressor is constructed so that the suppressor has a forward conduction through the Schottky rectifier under low current density and a reverse breakdown is controlled by the PN diode only.

* * * * *